United States Patent
Hsu et al.

(10) Patent No.: US 8,658,495 B2
(45) Date of Patent: Feb. 25, 2014

(54) METHOD OF FABRICATING ERASABLE PROGRAMMABLE SINGLE-POLY NONVOLATILE MEMORY

(75) Inventors: Te-Hsun Hsu, Hsinchu County (TW); Hsin-Ming Chen, Hsinchu (TW); Wen-Hao Ching, Hsinchu County (TW); Wei-Ren Chen, Pingtung County (TW)

(73) Assignee: Ememory Technology Inc., Hsin-Chu (TW)

( * ) Notice: Subject to any disclaimer, the term of this patent is extended or adjusted under 35 U.S.C. 154(b) by 0 days.

(21) Appl. No.: 13/602,404

(22) Filed: Sep. 4, 2012

(65) Prior Publication Data

US 2013/0237048 A1  Sep. 12, 2013

Related U.S. Application Data (63) Continuation-in-part of application No. 13/415,185, filed on Mar. 8, 2012.

(60) Provisional application No. 61/609,376, filed on Mar. 12, 2012.

(51) Int. Cl.
*H01L 29/788* (2006.01)

(52) U.S. Cl.
USPC ......................................................... 438/257

(58) Field of Classification Search
USPC .......... 438/257, 258; 257/314, 315, E21.422; 365/185.01, 185.29
See application file for complete search history.

(56) References Cited

U.S. PATENT DOCUMENTS

| | | | |
|---|---|---|---|
| 5,736,764 A | 4/1998 | Chang | |
| 5,761,121 A * | 6/1998 | Chang | 365/185.14 |
| 5,841,165 A | 11/1998 | Chang et al. | |
| 6,166,954 A | 12/2000 | Chern | |
| 6,678,190 B2 | 1/2004 | Yang et al. | |
| 6,914,288 B2 * | 7/2005 | Itou et al. | 257/314 |
| 7,078,761 B2 | 7/2006 | Wang et al. | |
| 2004/0047203 A1* | 3/2004 | Lee et al. | 365/202 |
| 2004/0065917 A1 | 4/2004 | Fan et al. | |
| 2004/0238873 A1* | 12/2004 | Koo et al. | 257/314 |
| 2005/0199936 A1 | 9/2005 | Wang et al. | |
| 2005/0258473 A1* | 11/2005 | Yoshida et al. | 257/315 |
| 2006/0033143 A1* | 2/2006 | Chen et al. | 257/315 |
| 2010/0032744 A1* | 2/2010 | Mitros et al. | 257/316 |

OTHER PUBLICATIONS

Di Bartolomeo et al. "A single-poly EEPROM cell for embedded memory applications", Solid-State Electronics 53, (2009), 644-648.
Lin et al. "A single-poly EEPROM Cell Structure Compatible to Standard CMOS Process" Solid-State Electronics 51, (2007), 888-893.
Vega-Castillo et al. "Single poly PMOS-based CMOS-compatible low voltage OTP", Technical University Hamburg-Harbug, Hamburg, Germany, (2005).

* cited by examiner

*Primary Examiner* — Michele Fan
(74) *Attorney, Agent, or Firm* — WPAT, PC; Justin King (57) ABSTRACT

The present invention provides a method of fabricating an erasable programmable single-poly nonvolatile memory, comprising the steps of: defining a first area and a second area in a first type substrate; forming a second type well region in the first area; forming a first gate oxide layer and a second gate oxide layer covering a surface of the first area, wherein the second gate oxide layer extends to and is adjacent to the second area; forming a DDD region in the second area; etching a portion of the second gate oxide layer above the second area; forming two polysilicon gates covering the first and the second gate oxide layers; and defining a second type doped region in the DDD region and defining first type doped regions in the second type well region.

9 Claims, 8 Drawing Sheets

METHOD OF FABRICATING ERASABLE PROGRAMMABLE SINGLE-POLY NONVOLATILE MEMORY

This is a continuation-in-part application of U.S. application Ser. No. 13/415,185, filed Mar. 8, 2012. The application claims the benefit of U.S. provisional application Ser. No. 61/609,376, filed Mar. 12, 2012, the subject matter of which is incorporated herein by reference

FIELD OF THE INVENTION

The present invention relates to a nonvolatile memory, and more particularly to a method of fabricating an erasable programmable single-poly nonvolatile memory.

BACKGROUND OF THE INVENTION

Figure 1:
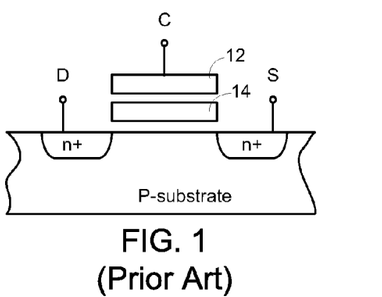
FIG. 1 (prior art) is a schematic cross-sectional view illustrating a conventional programmable dual-poly nonvolatile memory.

FIG. 1 is a schematic cross-sectional view illustrating a conventional programmable dual-poly nonvolatile memory. The programmable dual-poly nonvolatile memory is also referred as a floating-gate transistor. As shown in FIG. 1, this nonvolatile memory comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

In a case that the nonvolatile memory is in a programmed state, a high voltage (e.g. +16V) is provided by the drain line D, a ground voltage is provided by the source line S, and a control voltage (e.g. +25V) is provided by the control line C. Consequently, during the electrons are transmitted from the source line S to the drain line D through an n-channel region, the hot carriers (e.g. hot electrons) are attracted by the control voltage on the control gate 12 and injected into the floating gate 14. Under this circumstance, a great number of carriers are accumulated in the floating gate 14. Consequently, the programmed state may be considered as a first storage state (e.g. "0").

In a case that the nonvolatile memory is in a non-programmed state, no carrier is injected into the floating gate 14, and thus the non-programmed state may be considered as a second storage state (e.g. "1").

In other words, the characteristic curves of the drain current (id) and the gate-source voltage (Vgs) (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the programmable dual-poly nonvolatile memory should be separately produced, the process of fabricating the programmable dual-poly nonvolatile memory needs more steps and is incompatible with the standard CMOS manufacturing process.

Figures 2A, 2B:
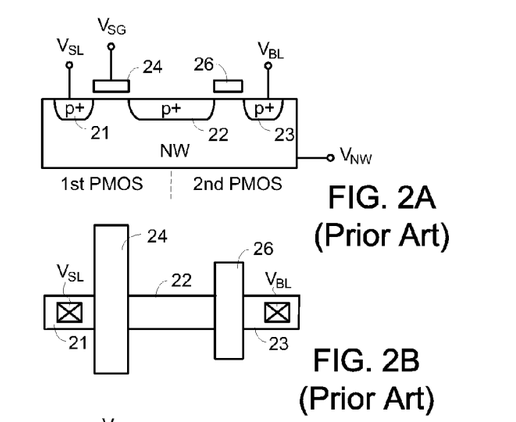
FIG. 2A (prior art) is a schematic cross-sectional view illustrating a conventional programmable single-poly nonvolatile memory disclosed in U.S. Pat. No. 6,678,190.
FIG. 2B (prior art) is a schematic top view illustrating the conventional programmable single-poly nonvolatile memory of FIG. 2A.
Figure 2C:
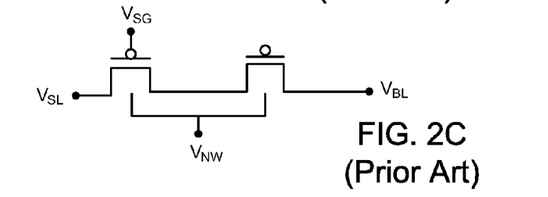
FIG. 2C (prior art) is a schematic circuit diagram illustrating the conventional programmable single-poly nonvolatile memory of FIG. 2A.

U.S. Pat. No. 6,678,190 discloses a programmable single-poly nonvolatile memory. FIG. 2A is a schematic cross-sectional view illustrating a conventional programmable single-poly nonvolatile memory disclosed in U.S. Pat. No. 6,678,190. FIG. 2B is a schematic top view illustrating the conventional programmable single-poly nonvolatile memory of FIG. 2A. FIG. 2C is a schematic circuit diagram illustrating the conventional programmable single-poly nonvolatile memory of FIG. 2A.

Please refer to FIGS. 2A-2C. The conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A p-type doped source region 21 is connected to a source line voltage $V_{SL}$. Moreover, a p-type doped drain region 22 may be considered as a combination of a p-type doped drain region of the first PMOS transistor and a first p-type doped region of the second PMOS transistor. A floating gate 26 is disposed over the second PMOS transistor. A second p-type doped region 23 of the second PMOS transistor is connected to a bit line voltage $V_{BL}$. Moreover, these PMOS transistors are constructed in an N-well region (NW). The N-well region is connected to an N-well voltage $V_{NW}$. The second PMOS transistor is used as a floating gate transistor.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the nonvolatile memory is programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. These nonvolatile memories are named as one time programming (OTP) memories.

Therefore, for multi-times programming (MTP) memories design, there is a need of providing an erasable programmable single-poly nonvolatile memory.

SUMMARY OF THE INVENTION

The present invention provides a method of fabricating an erasable programmable single-poly nonvolatile memory in order to obviate the drawbacks encountered from the prior art.

The present invention provides a method of fabricating an erasable programmable single-poly nonvolatile memory, comprising steps of: forming a gate oxide layer of a floating gate transistor; defining a first portion of the gate oxide layer above a channel region of the floating gate transistor, wherein the first portion of the gate oxide layer are injected by a plurality of carriers during a programmed state; defining a second portion of the gate oxide layer, wherein the second portion of the gate oxide layer are ejected by the carriers during an erase state; and covering a polysilicon gate on the gate oxide layer; wherein, a thickness of the first portion of the gate oxide layer is different from a thickness of the second portion of the second gate oxide layer.

The present invention provides a method of fabricating an erasable programmable single-poly nonvolatile memory, comprising steps of: defining a first area and a second area in a first type substrate; forming a second type well region in the first area; forming a first gate oxide layer and a second gate oxide layer covered on a surface of the first area, wherein the second gate oxide layer is extended to and is adjacent to the second area; forming a DDD region in the second area; etching a portion of the second gate oxide layer above the second area; forming two polysilicon gates covered on the first and the second gate oxide layers; and defining a second type doped region in the DDD region and a first type doped regions in the second type well region.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3A:
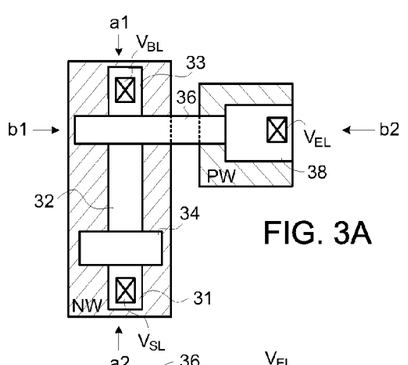
FIGS. 3A~3D schematically illustrate an erasable programmable single-poly nonvolatile memory according to an embodiment of the present invention.
Figure 3B:
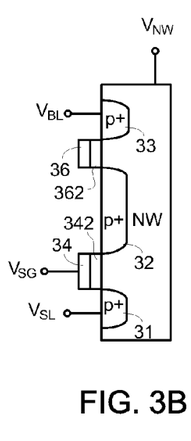
Figure 3C:
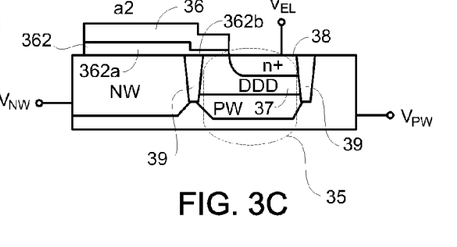
Figure 3D:
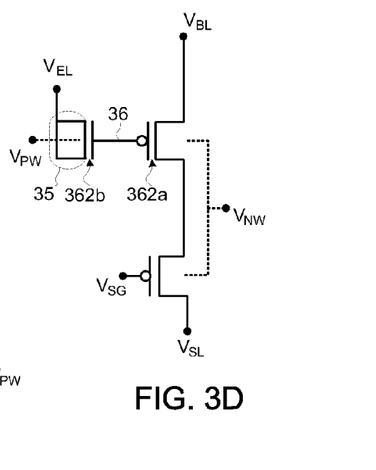

FIGS. 3A~3D schematically illustrate an erasable programmable single-poly nonvolatile memory according to an embodiment of the present invention. FIG. 3A is a schematic top view illustrating the erasable programmable single-poly nonvolatile memory according to the embodiment of the present invention. FIG. 3B is a schematic cross-sectional view illustrating the erasable programmable single-poly nonvolatile memory of FIG. 3A and taken along a first direction (a1-a2). FIG. 3C is a schematic cross-sectional view illustrating the erasable programmable single-poly nonvolatile memory of FIG. 3A and taken along a second direction (b1-b2). FIG. 3D is a schematic equivalent circuit diagram of the erasable programmable single-poly nonvolatile memory according to the embodiment of the present invention.

As shown in FIGS. 3A and 3B, the erasable programmable single-poly nonvolatile memory of the embodiment comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33, and gate oxides layer 342 and 362 are formed between the two polysilicon gates 34 and 36 and a top surface of the substrate.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$. The second PMOS transistor is used as a floating gate transistor.

As shown in FIGS. 3A and 3C, the erasable programmable single-poly nonvolatile memory of the embodiment comprises an n-type metal-oxide semiconductor (NMOS) transistor or a combination of the floating gate 36, gate oxide layer 362 and an erase gate region 35. The NMOS transistor is constructed in a P-well region (PW). A double diffused drain (DDD) region 37 is formed between an n-type doped region 38 and a P-well region (PW). In other words, the erase gate region 35 includes the P-well region (PW), the double diffused drain (DDD) region 37 and the n-type doped regions 38.

As shown in FIG. 3A, the floating gate 36 is extended to and is adjacent to the erase gate region 35. Moreover, a combination of the n-type doped region 38 and the DDD region 37 may be considered as a combination of an n-type doped source region and an n-type doped drain region of the NMOS transistor and the floating gate 36 may be considered as a gate of the NMOS transistor. The n-type doped region 38 is connected to an erase line voltage $V_{EL}$. In addition, the P-well region (PW) is connected to a P-well voltage $V_{PW}$. As shown in FIG. 3C, the gate oxide layer 362 is formed under the floating gate 36, and the gate oxide layer 362 includes two portions 362a and 362b. The first portion 362a of the gate oxide layer 362 is formed in the floating gate transistor (second PMOS transistor) and the second portion 362b of the gate oxide layer 362 is formed in the NMOS transistor (or above the erase gate region 35). According to the embodiment of the present invention, a thickness of the first portion 362a of the gate oxide layer 362 is thicker than a thickness of the second portion 362b of the gate oxide layer 362. Furthermore, a shallow trench isolation (STI) structure 39 is formed between the P-well region (PW) and the N-well region (NW).

Figure 4:
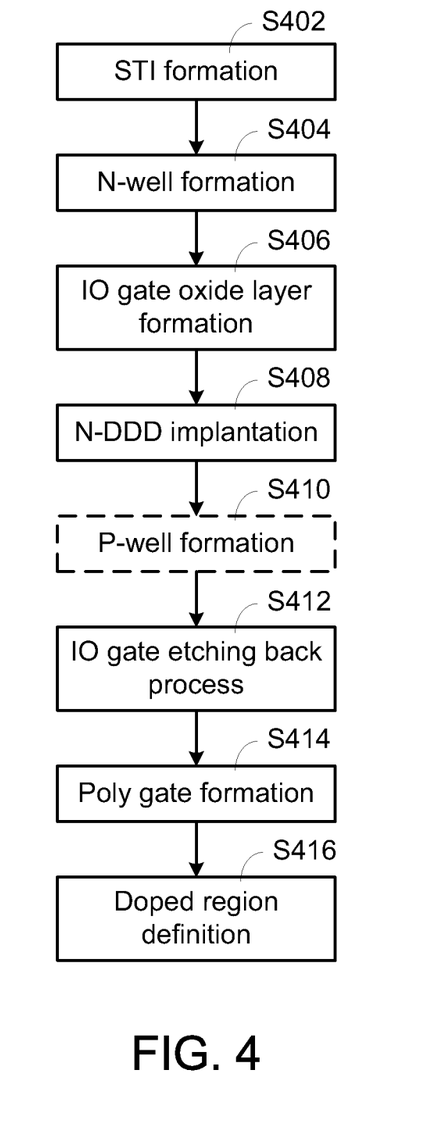
FIG. 4 illustrates the standard CMOS process for manufacturing the erasable programmable single-poly nonvolatile memory of the present invention.

FIG. 4 illustrates the standard CMOS process for manufacturing the erasable programmable single-poly nonvolatile memory of the present invention. These processes include STI formation (S402), N-well formation (S404), IO gate oxide layer formation (S406), N-DDD implantation (S408), P-well formation (S410), IO gate etching back process (S412), poly gate formation (S414), and doped region definition (S416).

FIG. 5A~5H shows the steps of manufacturing the erasable programmable single-poly nonvolatile memory according to the standard CMOS process. Because the main feature of the present invention is the erase gate region, only the top view and the cross-sectional view taken along the (b1-b2) direction are shown.

Figure 5A:
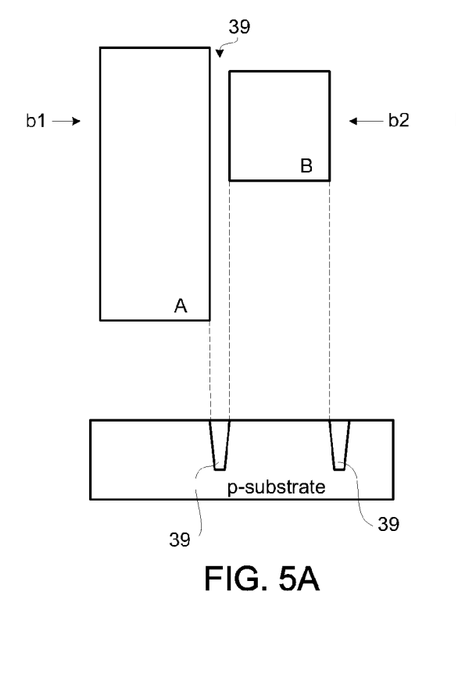
FIG. 5A~5H shows the steps of manufacturing the erasable programmable single-poly nonvolatile memory according to the standard CMOS process.
Figure 5B:
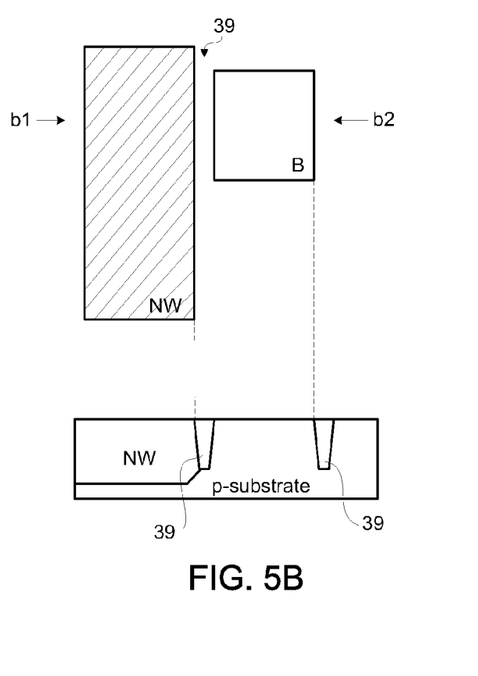

According to the top view in FIG. 5A, two separate areas (A and B) are defined in p-substrate after the STI formation process. According to the cross-sectional view in FIG. 5A, STI structures 39 are embedded in p substrate. According to the present invention, two serially-connected PMOS transistors will be formed in area A and the erase gate region will be formed in area B.

In the N-well formation process, only the area A is exposed and a N-well implantation process is performed. According to the top view and the cross-sectional view in FIG. 5B, an N-well region (NW) is formed in p-substrate.

Figure 5C:
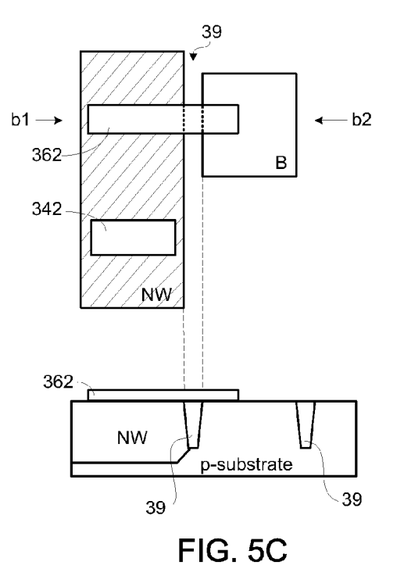

In the IO gate oxide layer formation process, two gate oxide layers 342 and 362 are formed on the surface of the substrate for two serially-connected PMOS transistors. Furthermore, the gate oxide layer 362 is extended to and is adjacent to the area B.

Figure 5D:
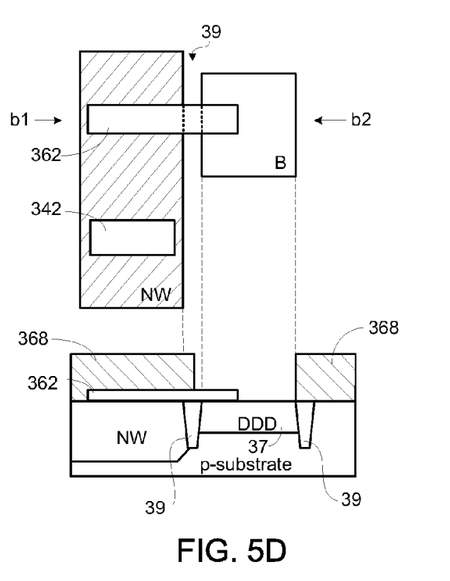
Figure 5E:
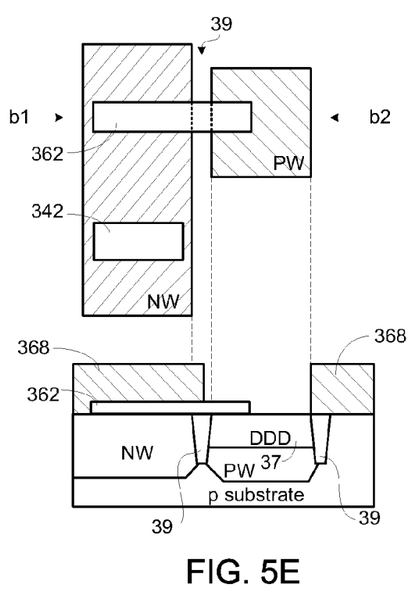
Figure 5F:
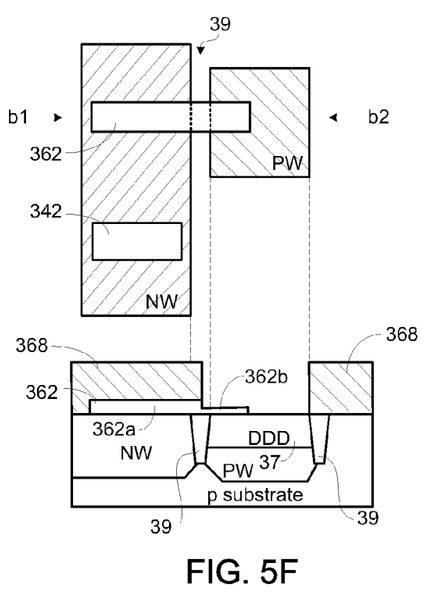

As shown in FIG. 5D, in the N-DDD implantation step, a mask layer, for example a photoresist (PR) mask layer or a SiN hard mask layer, is formed and only the area B is exposed and the other area is protected by a mask layer. And then, an N-DDD implantation process is performed. According to the cross-sectional view in FIG. 5D, a DDD region 37 is formed in p-substrate after the N-DDD implantation step.

After the N-DDD implantation process, the same mask layer used in the N-DDD implantation step is used again for the P-well formation process. According to the cross-sectional view in FIG. 5E, a P-Well region (PW) is formed under the DDD region 37. Because the p substrate has the same type with the P-well region (PW), the P-well formation process could be optionally performed.

After the P-well formation process, the same mask layer still is used again for the IO gate etching back process. According to the cross-sectional view in FIG. 5F, a first portion 362a of the gate oxide layer 362 protected by the mask layer is not etched and a second portion 362b of the gate oxide layer 362 not protected by the mask layer is etched to have a thinner thickness than the first portion 362a. According to the present invention, a short loop feedback system by monitoring a pattern on the substrate is used to exactly etch the gate oxide layer 362.

Figure 5G:
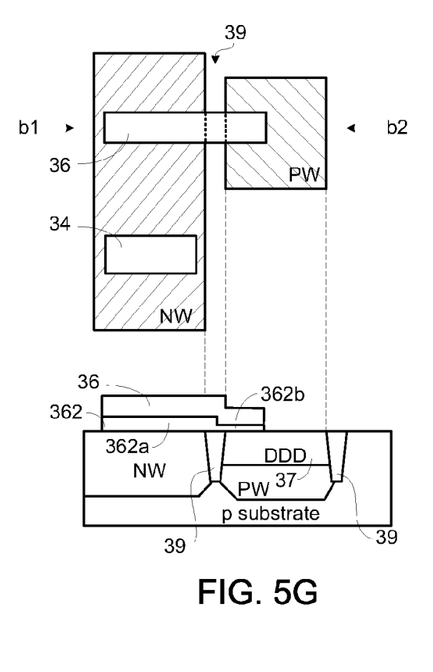

After removing the mask layer 368, a poly gate formation process is proceeded. As shown in FIG. 5G, two polysilicon gates 34 and 36 are covered on the two gate oxide layers 362 and 342 after the poly gate formation process.

Figure 5H:
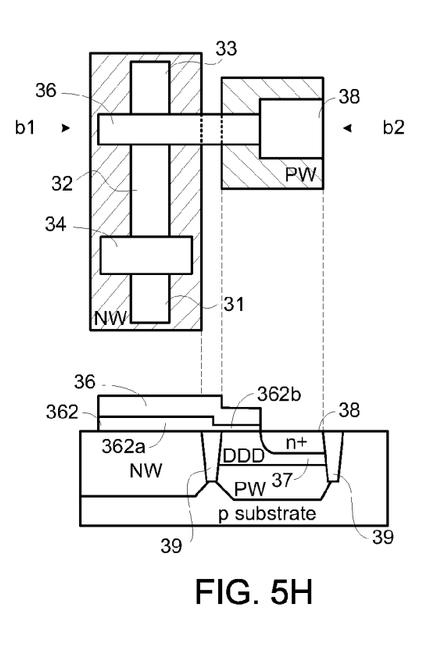

In the doped region definition process, a formation of n-type doped region and a formation of p-type doped region are separately performed. As shown in FIG. 5H, an n-type doped region 38 is formed in the DDD region 37 and the erase gate region is formed. Also, three p-type doped region 31 32 and 33 are formed in the NW region and the two serially-connected PMOS transistors are formed. Therefore, the erasable programmable single-poly nonvolatile memory of the present invention is manufactured.

Figure 6:
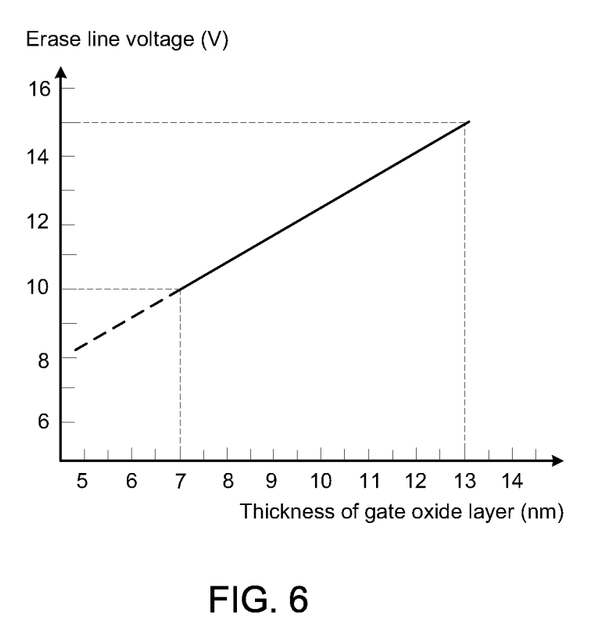
FIG. 6 is a plot illustrating the relation of the thickness of the gate oxide layer and the erase line voltage ($V_{EL}$).

FIG. 6 is a plot illustrating the relation of the thickness of the gate oxide layer and the erase line voltage ($V_{EL}$). In standard CMOS manufacturing process, thickness of the gate oxide layer 362 of 5V IO device is about 13 nm and the erase line voltage ($V_{EL}$) is about 15-16V to remove the storage carriers from the floating gate 36. However, the higher erase line voltage ($V_{EL}$) may result in junction breakdown and high ERS power in the erase gate region 35. According to the embodiment of the present invention, a portion (second portion 362b) of the gate oxide layer 362 is further etched to have a thinner thickness (about 7 nm) then the first portion 362a. Here, the erase line voltage ($V_{EL}$) will be about 10V~11V.

In the programmed state, the hot carriers (e.g. electrons) are transmitted through a channel region of the floating gate transistor corresponding to the floating gate 36, the first portion 362a of gate oxide layer 362 are tunneled by the hot electrons and then the hot electrons are injected into the floating gate 36. In the erased state, the second portion 362b of gate oxide layer 362 are tunneled by the storage carriers in the floating gate 36 and then the storage carriers are discharged out of the nonvolatile memory through the n-type doped region 38 and the DDD region 37. That is to say, a thickness of the first portion 362a for the hot electrons injected into the floating gate 36 is thicker than a thickness of the second portion 362b for storage carriers ejected from the gate oxide 36.

From the above description, the erasable programmable single-poly nonvolatile memory of the present invention is capable of decreasing the erase line voltage ($V_{EL}$). That is, by providing a lower erase line voltage $V_{EL}$, storage state of the nonvolatile memory of the present invention is changed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating an erasable programmable single-poly nonvolatile memory, comprising the steps of:
   defining a first area and a second area in a first type substrate;
   forming a second type well region in the first area;
   forming a first gate oxide layer and a second gate oxide layer covering a surface of the first area, wherein the second gate oxide layer extends to and is adjacent to the second area;
   processing the second gate oxide layer such that a thickness of a first portion of the second gate oxide layer above the first area is different from a thickness of a second portion of the second gate oxide layer above the second area;
   forming two polysilicon gates covering the first gate oxide layer and the second gate oxide layer; and
   defining a second type doped region in a double diffused drain region and defining first type doped regions in the second type well region.

2. The method as claimed in claim 1 further comprising forming the double diffused drain in the second area before said step of processing the second gate oxide layer.

3. The method as claimed in claim 1, wherein processing the second gate oxide layer comprises etching the second portion of the second gate oxide layer such that the thickness; of the first portion of the second gate oxide layer is thicker than the thickness of the second portion of the second gate oxide layer.

4. The method as claimed in claim 1 further comprising forming a first type well region in the second area, wherein the first type well region is formed under the double diffused drain region.

5. The method as claimed in claim 1, wherein the first type is p-type and the second type is n-type.

6. The method as claimed in claim 1, wherein a select transistor and a floating gate transistor connected in serial is manufactured after completing said step of defining first type doped regions in the second type well region.

7. The method as claimed in claim 6, wherein an erase gate region is manufactured after completing said step of defining a second type doped region in a double diffused drain region; and 8. The method as claimed in claim 7, wherein the second gate oxide layer forms a gate oxide layer of the floating gate transistor and the thickness of the first portion of the second date oxide layer is thicker than the thickness of the second portion of the second gate oxide layer formed above the erase gate region.

9. The method as claimed in claim 1, wherein a plurality of shallow trench isolation structures are formed and embedded in the first type substrate to define the first area and the second area.

* * * * *